United States Patent
Ju et al.

(10) Patent No.: US 10,201,112 B1
(45) Date of Patent: Feb. 5, 2019

(54) CONNECTOR ASSEMBLY

(71) Applicant: LOTES CO., LTD, Keelung (TW)

(72) Inventors: Ted Ju, Keelung (TW); Chin Chi Lin, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/032,410

(22) Filed: Jul. 11, 2018

(30) Foreign Application Priority Data

Jul. 14, 2017 (CN) .................... 2017 2 0851266 U

(51) Int. Cl.

| H01R 24/00 | (2011.01) |
|---|---|
| H05K 7/20 | (2006.01) |
| H01R 13/6581 | (2011.01) |
| H01R 13/6594 | (2011.01) |
| H01R 13/502 | (2006.01) |
| H01R 12/71 | (2011.01) |
| H01R 24/60 | (2011.01) |
| H01R 107/00 | (2006.01) |

(52) U.S. Cl.
CPC ....... *H05K 7/20154* (2013.01); *H01R 12/716* (2013.01); *H01R 13/502* (2013.01); *H01R 13/6581* (2013.01); *H01R 13/6594* (2013.01); *H01R 24/60* (2013.01); *H01R 2107/00* (2013.01)

(58) Field of Classification Search
CPC .. H01R 12/716; H01R 24/60; H01R 13/6581; H01R 13/6594; H01R 13/502; H05K 7/20154
See application file for complete search history.

(56) References Cited

U.S. PATENT DOCUMENTS

| 2013/0272649 | A1* | 10/2013 | Braunisch | ............... | G02B 6/12 |
| | | | | | 385/14 |
| 2016/0249919 | A1* | 9/2016 | Savage | ............... | A61B 17/072 |
| | | | | | 227/175.1 |
| 2016/0346609 | A1* | 12/2016 | Bailly | ............... | A63B 24/0062 |
| 2016/0375733 | A1* | 12/2016 | Lesesky | ........... | G06K 19/07758 |
| | | | | | 340/442 |
| 2018/0056871 | A1* | 3/2018 | Karner | ..................... | B60R 1/06 |

FOREIGN PATENT DOCUMENTS

| CN | 105610015 A | 5/2016 |
| TW | 201121159 A | 6/2011 |

* cited by examiner

*Primary Examiner* — Jean F Duverne
(74) *Attorney, Agent, or Firm* — Tim Tingkang Xia, Esq.; Locke Lord LLP

(57) ABSTRACT

A connector assembly includes: a socket connector and a plug connector. The socket connector includes a main body having a tongue, multiple mating terminals, and a first thermal conduction member. The tongue has two first surfaces arranged opposite to each other. Each mating terminal has a first contact portion, and the first contact portions are exposed from at least one of the first surfaces. The first thermal conduction member has a first mating portion exposed from the at least one first surface provided with the first contact portions. The plug connector includes: a circuit board; a chip provided on the circuit board; a mating joint having an insulating body and multiple conductive terminals provided on the insulating body; and a second thermal conduction member provided on the insulating body. The second thermal conduction member has a second mating portion and a conducting portion thermally conducted with the chip.

15 Claims, 9 Drawing Sheets

CONNECTOR ASSEMBLY

CROSS-REFERENCE TO RELATED PATENT APPLICATION

This non-provisional application claims priority to and the benefit of, pursuant to 35 U.S.C. § 119(a), patent application Serial No. CN201720851266.6, filed in China on Jul. 14, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a connector assembly, and more particularly to a connector assembly having a thermal conduction member.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A commonly used plug connector in the industry includes a circuit board, a mating joint electrically connected to one end of the circuit board, a cable electrically connected to the other end of the circuit board, and a metal shell covering a rear end of the mating joint and outside of the circuit board. Currently, due to the increasingly powerful functions of electronic devices, the signal transmission requirements on plug connectors are also increasing. In order to enable the plug connector to have greater data transmission bandwidth and the ability to transmit uncompressed audio signals and high resolution video signals, a chip is generally installed on the circuit board to enhance the decoding capability of the plug connector. However, it is well-known that, as the chip speed becomes faster and the required power is also increased, the chip will generate a lot of heat during operation. If the heat is not dissipated in time, the chip will become too hot and fail, and the plug connector will be damaged, resulting in failure of the entire electronic device.

In order to solve this problem, the metal shell is provided with an abutting portion, which elastically abuts the chip, such that the heat generated by the chip is transferred to the metal shell, and then heat exchange is performed with the outside air through the metal shell to achieve the purpose of heat dissipation. However, due to the low thermal conductivity of the metal shell, the heat transfer rate is slow, such that the heat generated by the chip cannot be quickly dissipated, resulting in poor heat dissipation effect, and affecting the reliability of the signal transmission of the plug connector.

Therefore, a heretofore unaddressed need to design a new connector assembly exists in the art to address the aforementioned deficiencies and inadequacies.

SUMMARY

The invention is directed to a connector assembly having a thermal conduction member, which can quickly dissipate heat generated by the chip inside the plug connector.

To achieve the foregoing objective, the present invention adopts the following technical solutions:

A connector assembly includes: a socket connector, including: a main body, having a tongue, wherein the tongue has two first surfaces provided opposite to each other; a plurality of mating terminals, provided on the main body, wherein each of the mating terminals has a first contact portion, and the first contact portions of the mating terminals are exposed from at least one of the first surfaces; and at least one first thermal conduction member, provided on the main body, wherein the first thermal conduction member has a first mating portion, and the first mating portion is exposed to the at least one of the first surfaces provided with the first contact portions of the mating terminals; and a plug connector, including: a circuit board; at least one chip, provided on the circuit board; a mating joint, electrically connected to one end of the circuit board, wherein the mating joint has an insulating body and a plurality of conductive terminals provided on the insulating body; and at least one second thermal conduction member, provided on the insulating body, wherein the second thermal conduction member has a second mating portion and a conducting portion, and the conducting portion is thermally conducted with the chip, wherein when the plug connector is mated with the socket connector, the first contact portions of the mating terminals are in contact with the conductive terminals to form an electrical connection, and the first mating portion is in contact with the second mating portion to form thermal conduction.

In certain embodiments, the first contact portions of the mating terminals and the first mating portion are provided side by side on the at least one of the first surfaces, and two opposite sides of the first mating portion are respectively provided with the first contact portions.

In certain embodiments, the first contact portions of the mating terminals and the first mating portion are provided side by side on the at least one of the first surface, and only one side of the first mating portion is provided with the first contact portions.

In certain embodiments, a width of the first mating portion is twice or more than twice a width of each of the first contact portions of the mating terminals.

In certain embodiments, the tongue is formed by a printed circuit board (PCB), each of the first contact portions is an electrical conduction trace on the PCB, and the first mating portion is a thermal conduction trace on the PCB.

In certain embodiments, each of the first surfaces is provided with multiple ones of the first contact portions, the first mating portion is exposed from each of the first surfaces, the conductive terminals have a plurality of second contact portions arranged in two rows, and the plug connector is provided with two second mating portions correspondingly in contact with the first mating portion.

In certain embodiments, each of the first surfaces is provided with multiple ones of the first contact portions and a first mating portion, the conductive terminals have a plurality of second contact portions arranged in two rows, and the plug connector is provided with two second mating portions correspondingly in contact with the two first mating portions of the first surfaces.

In certain embodiments, the socket connector further comprises a metal shell, the metal shell surrounds the tongue to define an accommodating cavity therebetween, each of the first surfaces is provided with multiple ones of the first contact portions and at least two first mating portions, and the first contact portions and the first mating portions exposed from the two first surfaces are respectively symmetrical about a center point of the accommodating cavity at 180 degrees.

In certain embodiments, the conducting portion protrudes out of the insulating body and is in contact with the chip to form thermal conduction.

In certain embodiments, the mating joint further has a shielding shell provided outside the insulating body, and the second mating portion is accommodated in the shielding shell.

In certain embodiments, the plug connector further comprises a masking shell provided at a rear end of the shielding shell, the circuit board is located in the masking shell, and the masking shell has an abutting portion in contact with the chip or the conducting portion.

In certain embodiments, at least one of the first thermal conduction member and the second thermal conduction member is a thermal transistor or a capillary.

In certain embodiments, the mating terminals on each of the first surfaces are provided side by side in a left-right direction, and comprise, sequentially from left to right, a grounding terminal, a pair of differential signal terminals for transmitting universal serial bus (USB) 3.0 signals, a power terminal, a reserved terminal, a pair of USB 2.0 terminals, a reserved terminal, a power terminal, a pair of differential signal terminals for transmitting USB 3.0 signals and a grounding terminal.

In certain embodiments, the socket connector is mounted on a main board and exposed from one side of a casing, the main board is located in the casing, a heat dissipating device is provided in the casing, the at least one first thermal conduction member has a heat dissipating portion protruding out of the socket connector, and the heat dissipating device is configured for dissipating heat from the heat dissipating portion.

In certain embodiments, a front end of the insulating body has a mating slot configured to accommodate the tongue, each of the conductive terminals has a second contact portion, the second contact portion and the second mating portion respectively protrude into the mating slot, the plug connector further comprises two latch arms located at a left side and a right side of the mating slot, each of the latch arms has a latch portion protruding into the mating slot, the socket connector further comprises a middle shielding plate located between the two first surfaces, the middle shielding plate has two latch notches respectively exposed from a left side and a right side of the tongue, and the latch portions of the two latch arms are configured to be buckled to the latch notches.

Compared with the related art, certain embodiments of the present invention has the following advantages: the socket connector is provided with the first thermal conduction member, the first thermal conduction member has the first mating portion, and the first mating portion is exposed from at least one of the first surfaces of the tongue provided with the first contact portions. The plug connector is provided with the second thermal conduction member, and the second thermal conduction member is provided with the second mating portion and the conducting portion thermally conducted with the chip inside the plug connector. When the plug connector is completely mated with the socket connector, the first contact portions are in contact with the second contact portions to form an electrical connection, the second mating portion is in contact with the first mating portion to form a thermal conduction, and heat generated by the chip is transferred to the first thermal conduction member through the second thermal conduction member, thereby quickly dissipating the heat generated by the chip out of the inside of the plug connector.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
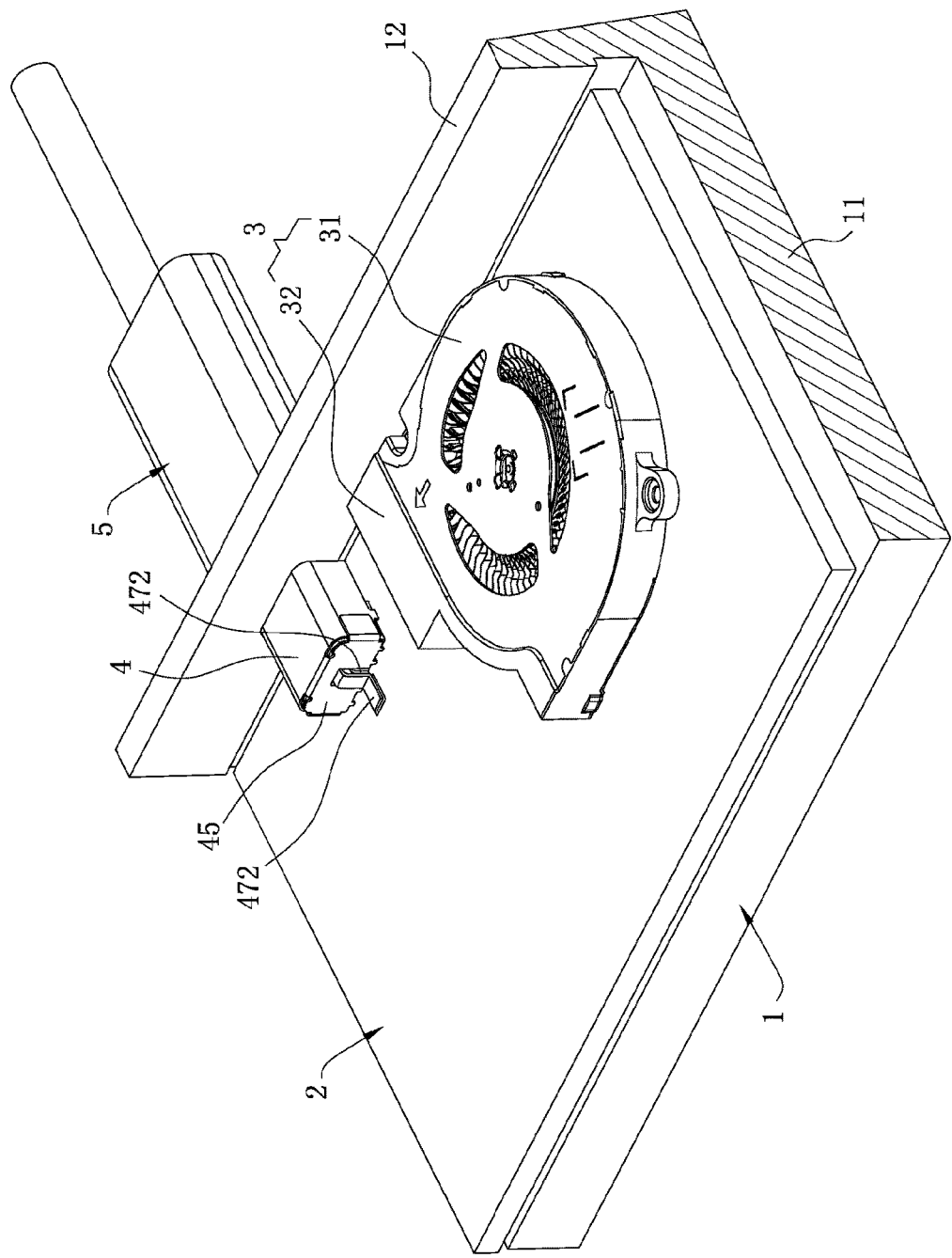
FIG. 1 is a perspective view of a connector assembly according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-9. In accordance with the purposes of this invention, as embodied and broadly described herein, this invention, in one aspect, relates to a connector assembly.

Referring to FIG. 1 to FIG. 7, a connector assembly according to a first embodiment of the present invention is provided. The connector assembly includes a socket connector 4 and a plug connector 5. The socket connector 4 is mated with the plug connector 5 in a front-rear direction. The socket connector 4 is mounted on a main board 2 provided in the casing 1, and the socket connector 4 is electrically connected with the main board 2. A heat dissipating device 3 is further provided in the casing 1, and the heat dissipating device 3 is adjacent to the socket connector 4.

Figure 5:
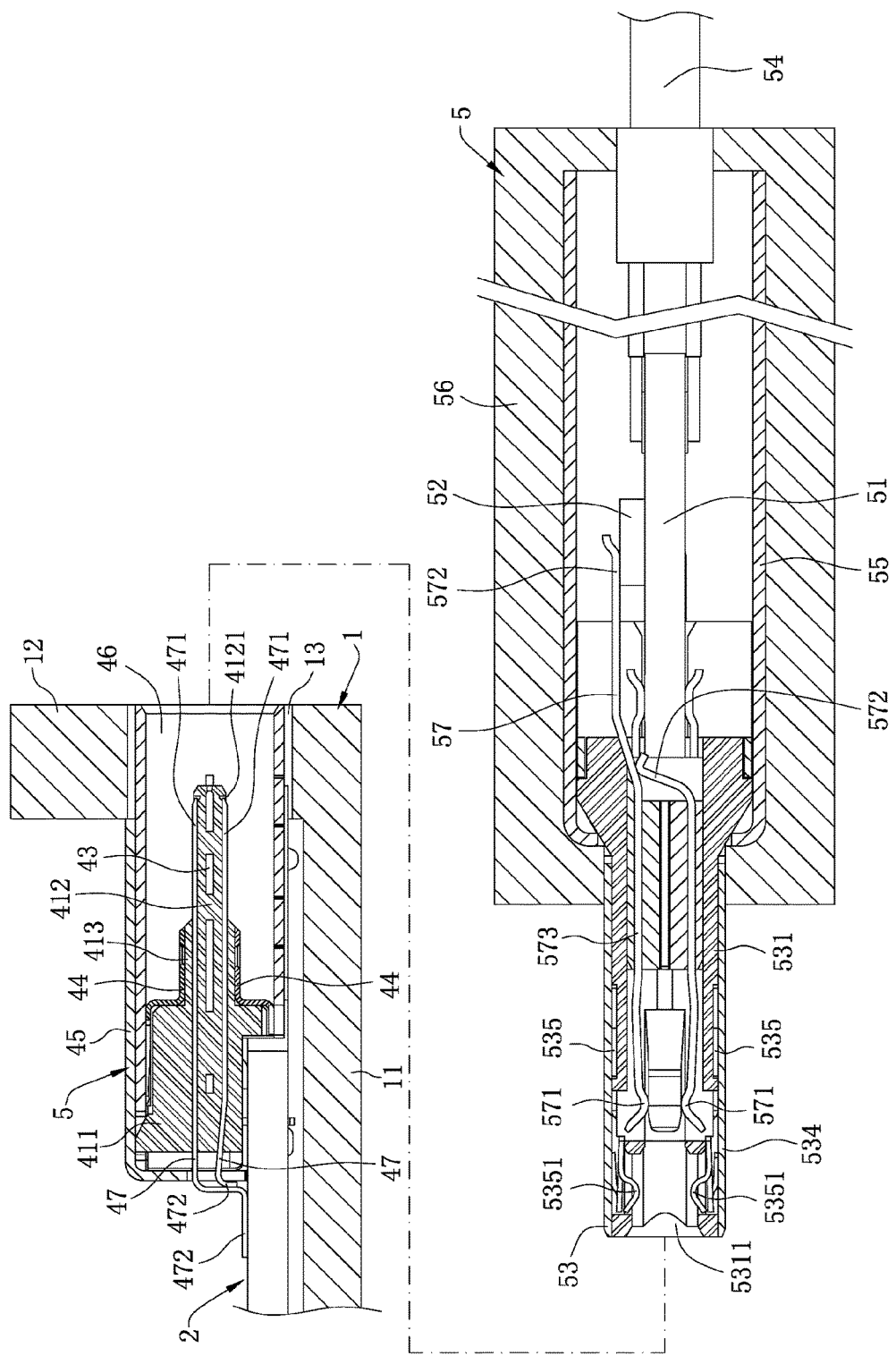
FIG. 5 is a sectional view of FIG. 1 before the plug connector is mated with the socket connector.

Referring to FIG. 1 and FIG. 5, the casing 1 may be a shell of a portable computer, or may be desktop computer mainframe box. Of course, the casing 1 may also be a shell of other types of electronic devices or the like. The casing 1 may be made of a plastic material or metal material. In this embodiment, the casing 1 is made of a plastic material. The casing 1 has a bottom wall 11 and multiple side walls 12 extending upward from the bottom wall 11. The main board 2 is mounted on the bottom wall 11, and one of the side walls 12 is provided with an opening 13 communicating with outside. The socket connector 4 is partially exposed from the opening 13.

Referring to FIG. 1, in this embodiment, the heat dissipating device 3 is mounted on the main board 2. The heat dissipating device 3 is a fan. The heat dissipating device 3 has a fan body 31 and an air outlet 32 connected to the fan body 31, and the air outlet 32 directly faces the socket connector 4. In other embodiments, the heat dissipating device 3 may also be mounted on another component or device in the casing 1, or the heat dissipating device 3 may also be mounted on the casing 1.

Figure 3:
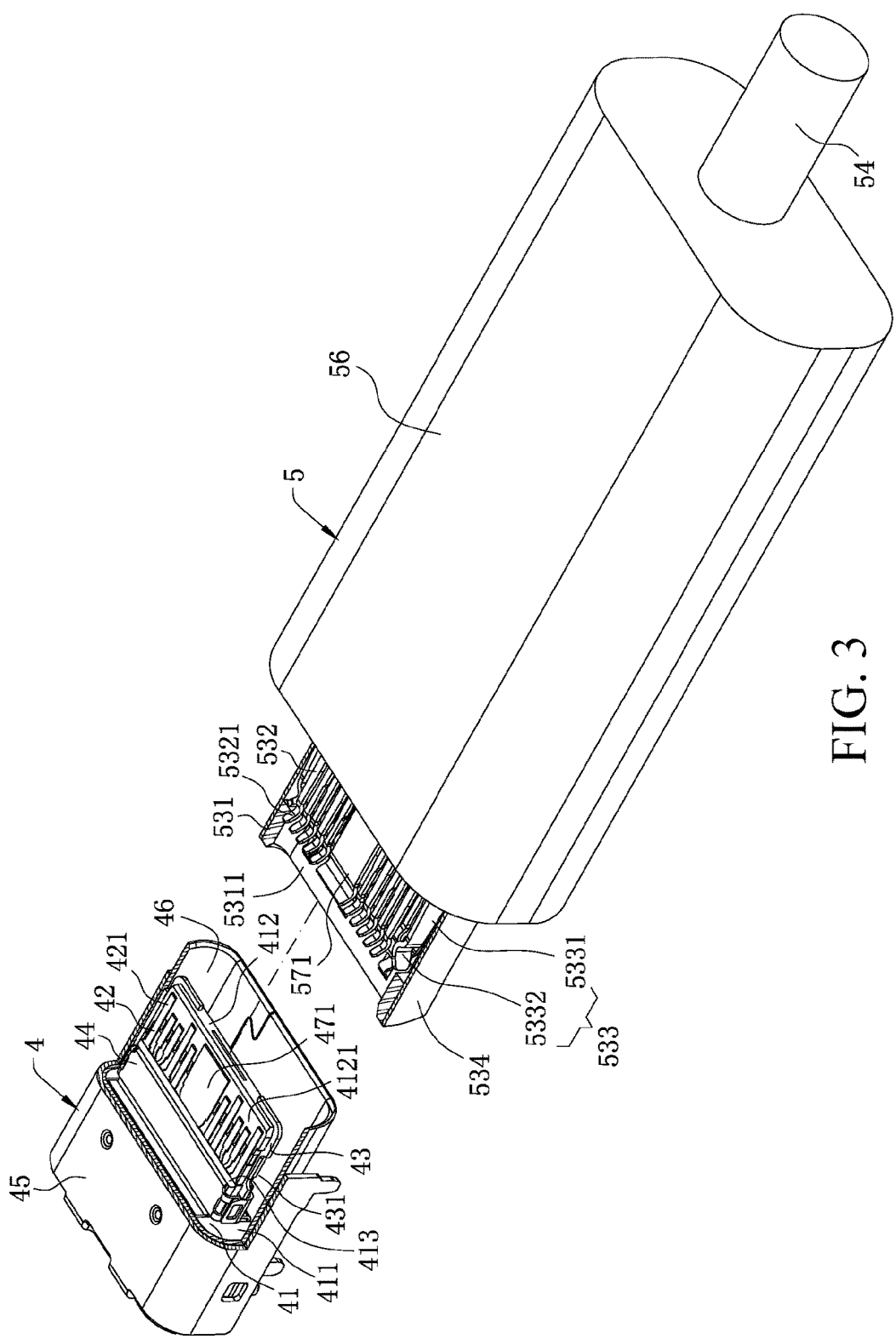
FIG. 3 is a local perspective sectional view of FIG. 1 before the plug connector is inserted into a socket connector.
Figure 4:
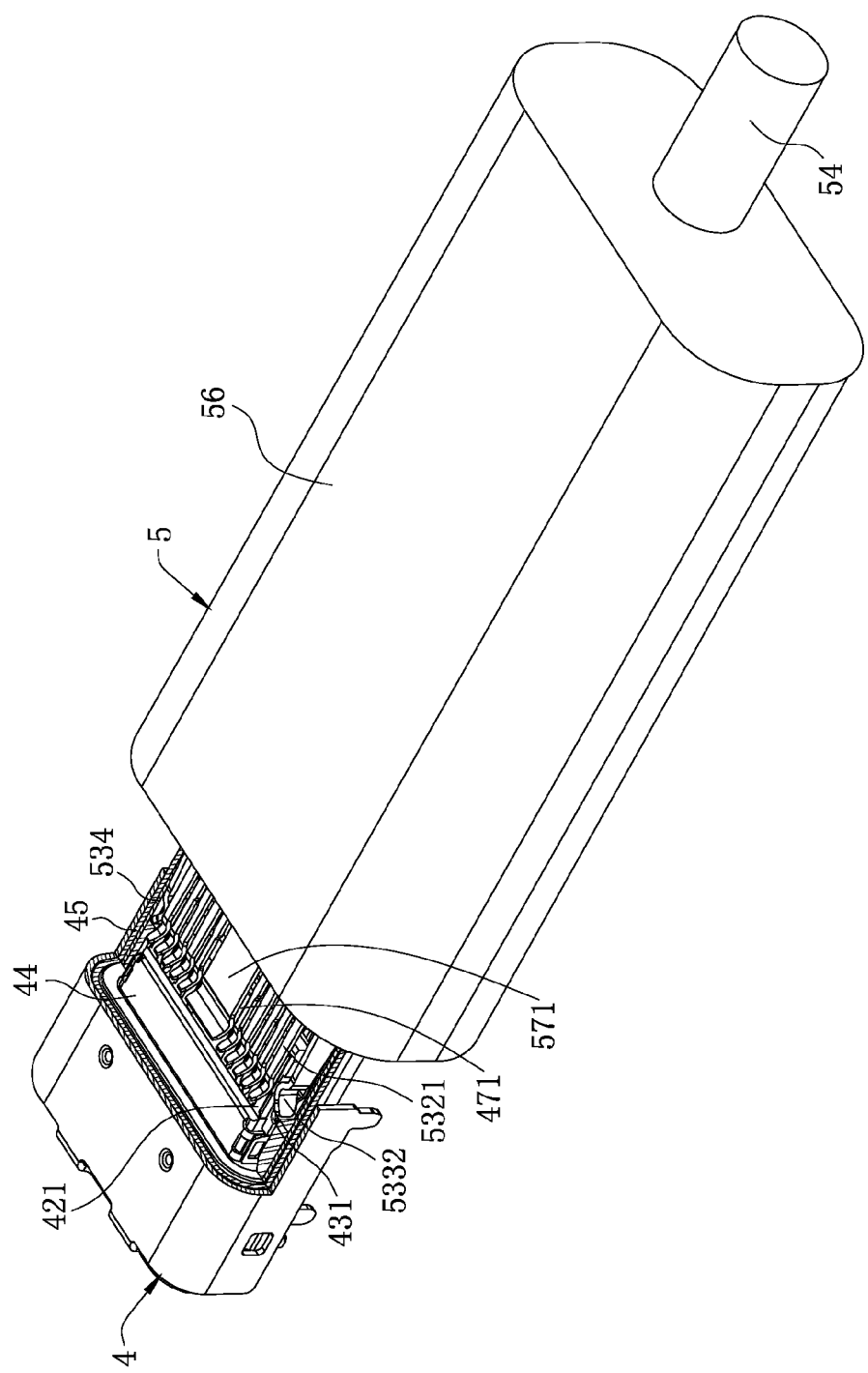
FIG. 4 is a perspective view of FIG. 3 when the plug connector is completely mated with the socket connector.
Figure 6:
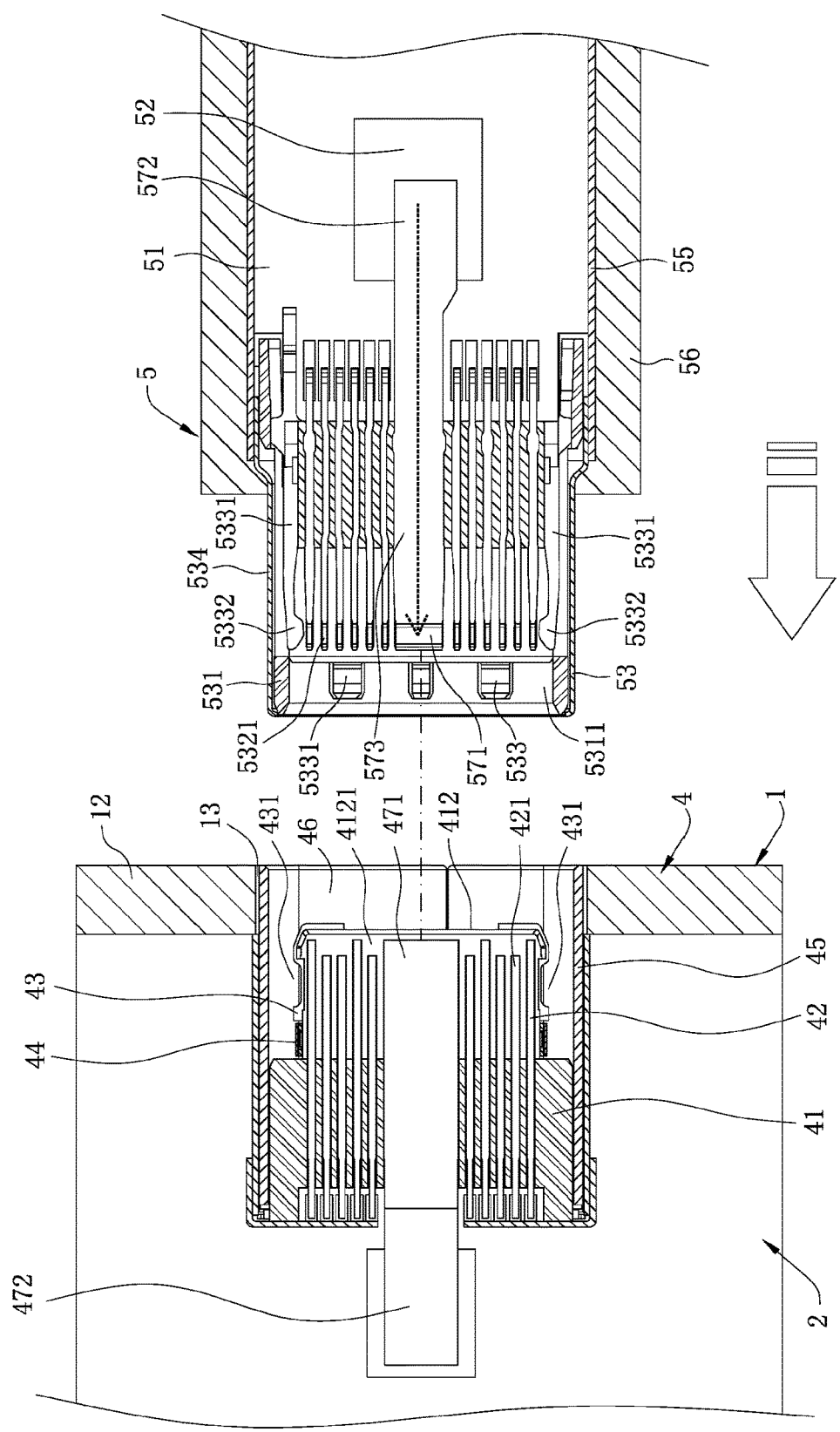
FIG. 6 is another sectional view of FIG. 1 before the plug connector is mated with the socket connector.
Figure 7:
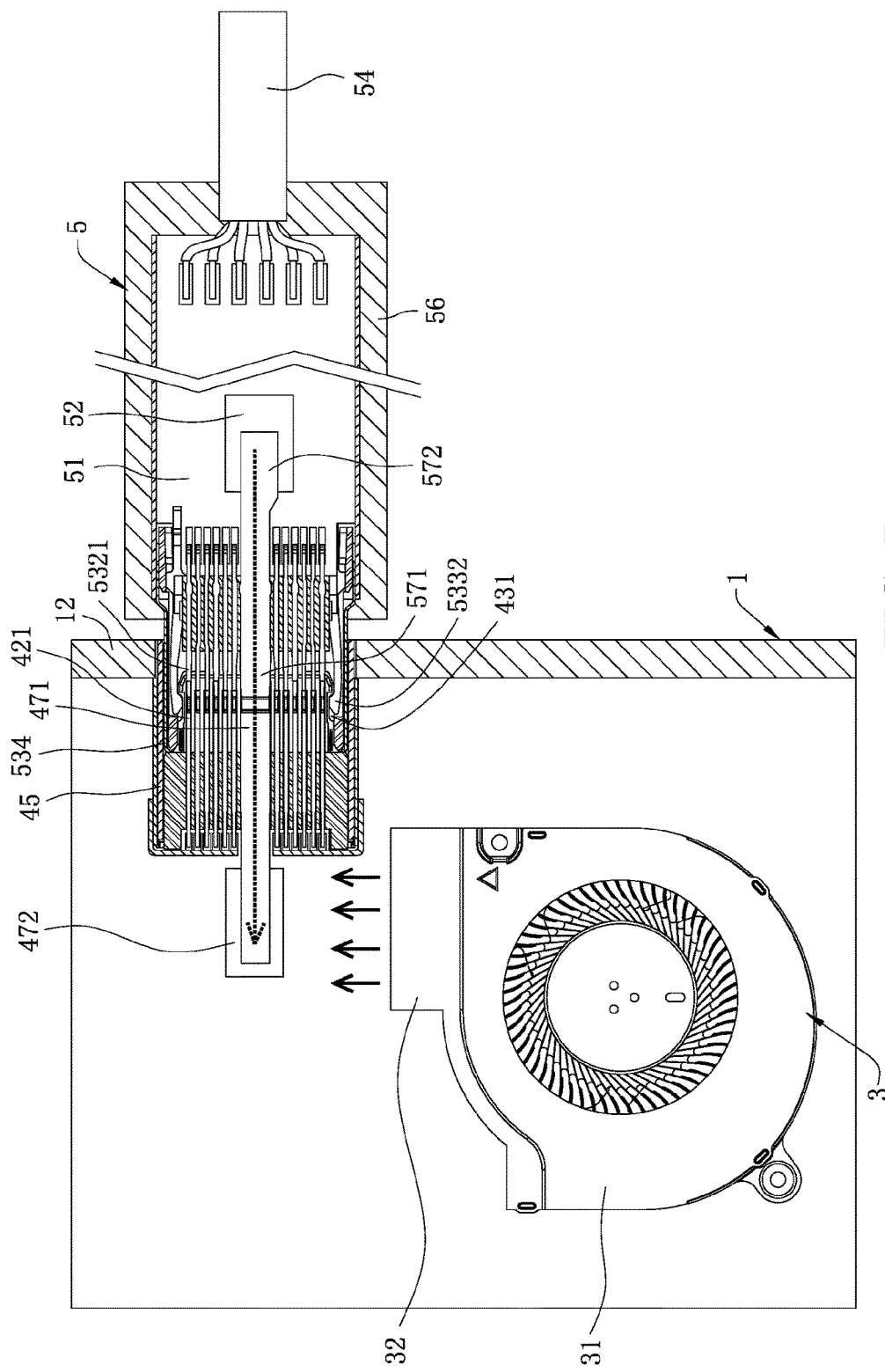
FIG. 7 is a sectional view of FIG. 1 when the plug connector is completely mated with the socket connector.

Referring to FIG. 3, FIG. 5 and FIG. 6, the socket connector 4 includes a main body 41, multiple mating terminals 42, a middle shielding plate 43, two grounding members 44, a metal shell 45 and two first thermal conduction members 47. In this embodiment, the main body 41 is made of an insulating material. The main body 41 has a base 411, a tongue 412 located at one end of the base 411 and a step portion 413 provided between the base 411 and the tongue 412. The base 411, the step portion 413 and the tongue 412 are sequentially provided in the front-rear direction. The tongue 412 has two first surfaces 4121 provided vertically opposite to each other. The mating terminals 42 are provided in upper and lower rows on the main body 41, and each of the mating terminals 42 has a first contact portion 421. The first contact portions 421 of the mating terminals 42 are exposed from the two first surfaces 4121 of the tongue 412. The middle shielding plate 43 is located between the two first surfaces 4121. That is, the middle shielding plate 43 is located between the two rows of the first contact portions 421. The left and right sides of the middle shielding plate 43 correspondingly protrude out of the left and right sides of the tongue 412. The middle shielding plate 43 further has two latch notches 431 respectively exposed from the left and right sides of the tongue 412. The two grounding members 44 are provided on the opposite upper and lower surfaces of the step portion 413, and the two grounding members 44 are buckled with each other on the left and right sides of the step portion 413. The grounding members 44 are in contact with the metal shell 45. The metal shell 45 is sleeved over the main body 41, and the metal shell 45 forms an accommodating cavity 46 around the tongue 412.

Referring to FIG. 3, FIG. 5 and FIG. 6, the first thermal conduction members 47 have favorable thermal conductivity. The thermal conductivity of the first thermal conduction members 47 is higher than the thermal conductivity of the metal shell 45. The first thermal conduction members 47 are provided on the main body 41, and the first thermal conduction members 47 extend in the front-rear direction. Each of the first thermal conduction members 47 has a first mating portion 471 and a heat dissipating portion 472, and the first mating portion 471 and the heat dissipating portion 472 are located on two opposite ends of each first thermal conduction member 47. The two first mating portions 471 of the two first thermal conduction members 47 are correspondingly exposed from the two first surfaces 4121. That is, each of the first surfaces 4121 is provided with one of the first mating portions 471. The first contact portions 421 of the mating terminals 42 and the first mating portion 471 on each of the first surfaces 4121 are provided side by side in the left-right direction, and the left and right sides of the first mating portion 471 are respectively provided with multiple ones of the first contact portions 421. Further, each of the first contact portions 421 and the first mating portions 471 is a flat plate structure, but a width of each first mating portion 471 in the left-right direction is twice or more than twice the width of each first contact portion 421 in the left-right direction. In this embodiment, the first mating portion 471 in the left-right direction is located in a middle position of the tongue 412. The two heat dissipating portions 472 of the two first thermal conduction members 47 are in contact with each other above the main board 2. One of the heat dissipating portions 472 protrudes out of the main body 41 and is exposed from the socket connector 4, and is in contact with a heat dissipation pattern (not illustrated) on the main board 2 to form a thermal conduction. In this embodiment, the first contact portions 421 and the first mating portions 471 exposed from the two first surfaces 4121 are symmetrical about a center of the accommodating cavity 46 at 180 degrees. In another embodiment, the socket connector 4 may be provided with one first thermal conduction member 47, but the first thermal conduction member 47 is only provided with one heat dissipating portion 472 and two first mating portions 471 integrally extending from the heat dissipating portion 472, and the two first mating portions 471 are aligned vertically. In yet another embodiment, the socket connector 4 can be only provided with one first thermal conduction member 47, and a thickness of the first mating portion 471 in a vertical direction is greater than a thickness of the tongue 412 in the vertical direction. Thus, the first mating portion 471 may be simultaneously exposed from the upper and lower first surfaces 4121. The middle shielding plate 43 is provided with a slot (not illustrated) in a position corresponding to the first thermal conduction member 47 in the vertical direction to give way to the first thermal conduction member 47, and the middle shielding plate 43 is not in contact with the first thermal conduction member 47. The heat dissipating portion 472 may also be in contact with the metal shell 45 so as to implement heat dissipation through the metal shell 45, or the heat dissipating portion 472 is connected with a heat sink (not illustrated) with heat dissipation fins. In still another embodiment, the first thermal conduction members 47 may selectively be capillaries or thermal transistors. Since a capillary has a smaller diameter, a capillary bundle formed by multiple capillaries may be used, and both the capillaries and the thermal transistors have favorable thermal conductivity.

In a conventional socket connector satisfying USB Type-C terminal arrangement, the mating terminals of the conventional socket connector are provided in upper and lower rows on the tongue. The mating terminals in each row include, sequentially from left to right, a grounding terminal, a pair of differential signal terminals (high-speed terminals) for transmitting USB 3.0 signals, a power terminal, a reserved terminal, a pair of USB 2.0 terminals, a reserved terminal, a power terminal, a pair of differential signal terminals (high-speed terminals) for transmitting USB 3.0 signals and a grounding terminal. Referring to FIG. 3 and FIG. 5, in this embodiment, each of the first mating portions 471 occupies a position of the pair of USB 2.0 terminals on the first surface 4121, and the other mating terminals 42 are unchanged. In other words, the first mating portions 471 in this embodiment replace the pair of USB 2.0 terminals on the first surface 4121. Thus, the socket connector 4 is a non-standard USB Type-C socket connector.

Referring to FIG. 3, FIG. 5 and FIG. 6, the plug connector 5 includes a circuit board 51, at least one chip 52 provided on the circuit board 51, a mating joint 53 electrically connected to one end of the circuit board 51, a cable 54 electrically connected to the other end of the circuit board 51, a masking shell 55, an insulating shell 56, and two second thermal conduction members 57. The mating joint 53 has an insulating body 531, multiple conductive terminals 532 provided on the insulating body 531, a latch member 533, a shielding shell 534 sleeved over the insulating body 1, and two grounding elastic sheets 535 provided on the upper and lower surfaces of the insulating body 1. A front end of the insulating body 531 has a mating slot 5311. The conductive terminals 532 are provided in two rows, and each of the conductive terminals 532 has a second contact portion 5321 protruding forward into the mating slot 5311. The second contact portions 5321 of the conductive terminals 532 are provided in two rows on the upper and lower sides of the mating slot 5311. The latch member 533 is formed by blanking a metal sheet. The latch member 533 has a body portion (not illustrated) and two latch arms 5331 formed by extending forward from two opposite sides of the body portion. The body portion is located between the two rows of the conductive terminals 532 and configured to shield signal interference between the two rows of the conductive terminals 532. The two latch arms 5331 are located on the left and right sides of the insulating body 531, and each of the latch arms 5331 has a latch portion 5332 protruding into the mating slot 5311. The latch portions 5332 are configured to be buckled to the latch notches 431. The shielding shell 534 is a tubular structure seamlessly connected and formed by an drawing process. Each of the grounding elastic sheets 535 is sandwiched between the insulating body 1 and the shielding shell 534. Each of the grounding elastic sheets 535 has multiple grounding contacts 5351 protruding into the mating slot 5311, and the grounding contacts 5351 are located in front of the second contact portions 5321. The masking shell 55 is sleeved over a rear end of the shielding shell 534. The circuit board 51 is located in the masking shell 55. The overlapped portions of the masking shell 55 and the shielding shell 534 are fixed together by spot soldering, or may also be fixed to each other through a buckle structure. The insulating shell 56 covers the masking shell 55 and the shielding shell 534. The mating joint 73 projects forward out of a front end surface of the insulating shell 56, and the shielding shell 534 also projects forward out of the front end surface of the insulating shell 56. In this embodiment, the insulating shell 56 is injection-molded outside of the masking shell 55, the shielding shell 534 and the cable 54.

Referring to FIG. 3, FIG. 5 and FIG. 6, as the increasingly higher signal transmission requirements on the plug connector 5 and the enhancement of the signal processing capacity, the chip 52 will generate abundant heat during operation. In order to enable the heat generated by the chip 52 inside the plug connector 5 to be well dissipated, the plug connector 5 is provided with the second thermal conduction members 57 having favorable thermal conductivity. The material of the second thermal conduction members 57 is different from the materials of the masking shell 55 and the shielding shell 534, and the thermal conductivity of the second thermal conduction members 57 is higher than the thermal conductivity of the masking shell 55 and the shielding shell 534. The second thermal conduction members 57 are provided on the insulating body 531 and accommodated in the shielding shell 534. The second thermal conduction members 57 extend in the front-rear direction. Each of the second thermal conduction members 57 is provided with a second mating portion 571, a conducting portion 572 and a connecting portion 573 connected between the second mating portion 571 and the conducting portion 572. The connecting portion 573 is fixedly provided on the insulating body 531. The second mating portion 571 protrudes forward into the mating slot 5311. The two second mating portions 571 of the two second thermal conduction members 57 are located on the upper and lower sides of the mating slot 5311, and each second mating portion 571 is located in a middle position of the second contact portions 5321 in the corresponding row in the left-right direction. Each of the second contact portions 5321 and the second mating portions 571 is an elastic contact arm structure, but a width of each second mating portion 571 in the left-right direction is twice or more than twice the width of each second contact portion 5321 in the left-right direction. The two rows of the second contact portions 5321 and the two second mating portions 571 are symmetrical about a center of the mating slot 5311 at 180 degrees. The two conducting portions 572 are in contact with the rear end of the insulating body 531, and one of the conducting portions 572 extends backward out of the insulating body 531 to be in contact with the chip 52. Further, thermal conduction paste or another high-thermal-conductivity component may also be provided between the conducting portions 572 and the chip 52.

Figure 2:
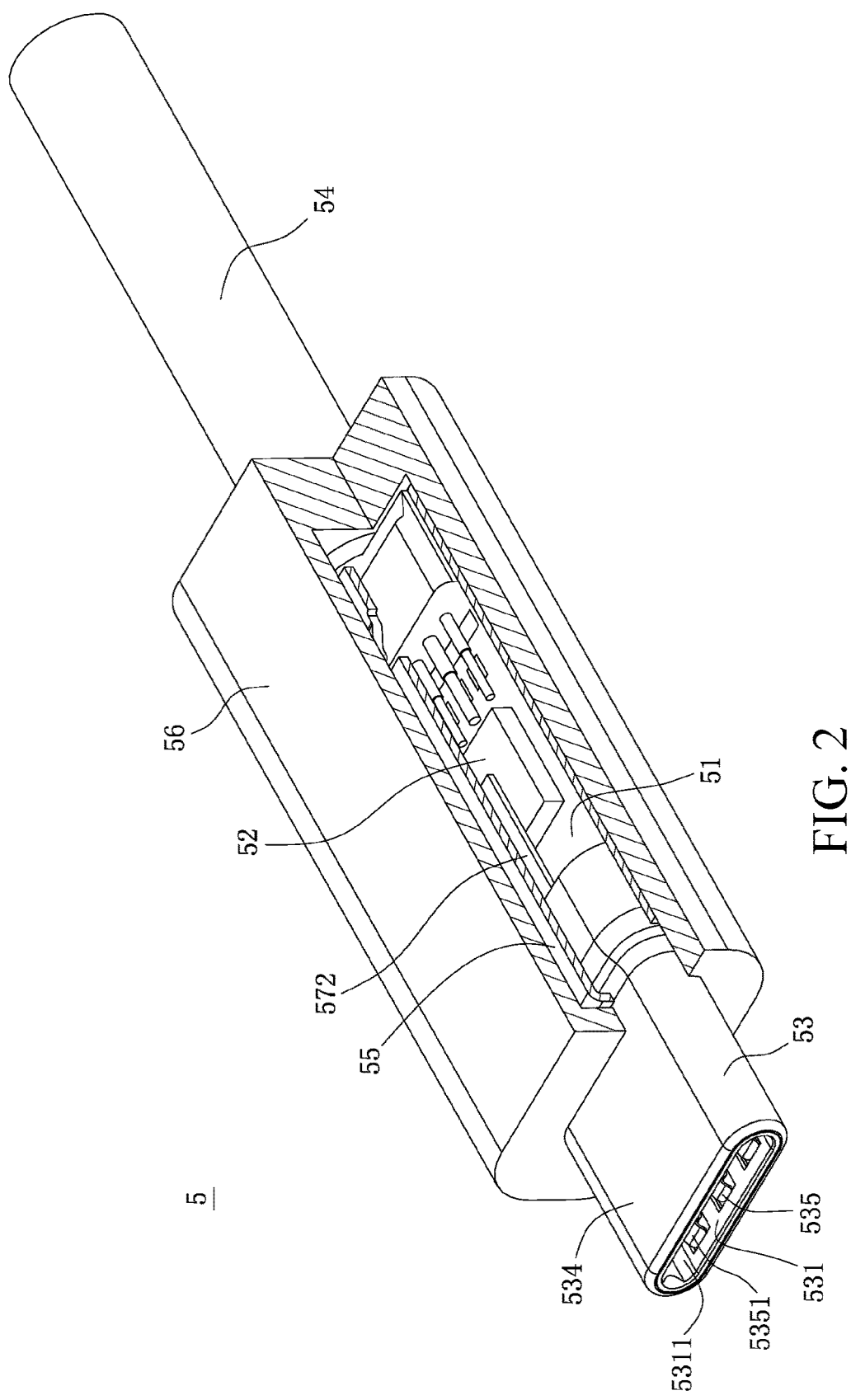
FIG. 2 is a local perspective sectional view of the plug connector in FIG. 1.
Figure 8:
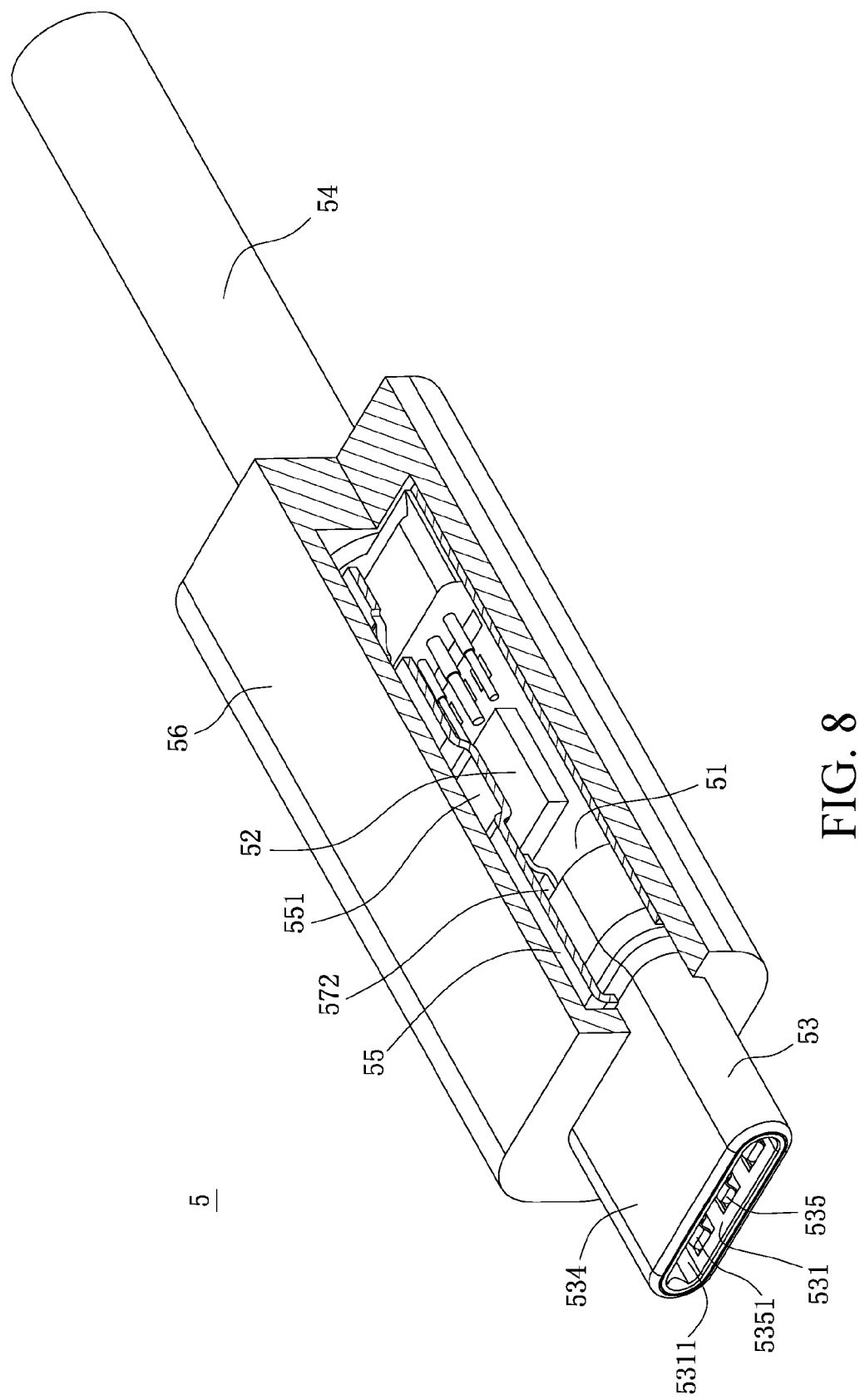
FIG. 8 is a schematic view of a plug connector according to another embodiment of the present invention.

Referring to FIG. 2, FIG. 5 and FIG. 8, the plug connector 5 may change its local structure or add one or more structures, so the heat generated by the chip 52 may also be abundantly dissipated from the inside of the plug connector 5. For example, the two conducting portions 572 respectively protrude out of the rear end of the insulating body 531 to be respectively in contact with the chip 52 to form a thermal conduction. In another example, the plug connector 5 may be provided with one second thermal conduction member 57, and the second thermal conduction member 57 has one conducting portion 572 and the two second mating portions 571 integrally extending forward from the conducting portion 572. The two second mating portions 571 are aligned vertically, and the conducting portion 572 also protrudes out of the rear end of the insulating body 531 to be in contact with the chip 52 to form a thermal conduction. In a further example, the conducting portion 572 is in contact with the shielding shell 534 or the masking shell 55, and the shielding shell 534 or the masking shell 55 is additionally provided with an abutting portion 551. The abutting portion 551 is in contact with the chip 52 to form a thermal conduction. Further, thermal conduction paste or another high-thermal-conductivity component may be also provided between the abutting portion 551 and the chip 52. In yet another example, the masking shell 55 is additionally provided with at least one abutting portion 551, and the abutting portion 551 abuts the chip 52 or abuts the conducting portion 572. Meanwhile, at least one of the conducting portions 572 is in contact with the chip 52 to form a thermal conduction. In still another example, multiple chips 52 may be provided, and the chips 52 may be provided on one surface of the circuit board 51 or provided on the opposite upper and lower surfaces of the circuit board 51. The two conducting portions 572 of the two second thermal conduction members 57 may be respectively in contact with different chips 52, or may also be in contact with the same chip 52. In yet a further example, the second thermal conduction members 57 may selectively be capillaries or thermal transistors. Since a capillary has a small diameter, a capillary bundle formed by multiple capillaries may be used, and both the capillaries and the thermal transistors have favorable thermal conductivity.

Referring to FIG. 3 and FIG. 5, the plug connector 5 and the socket connector 4 need to match with each other, so the arrangement of the conductive terminals 532 in the plug connector 5 should be the same as that of the socket connector 4. Similarly, in a conventional plug connector satisfying the USB Type-C terminal arrangement, the conductive terminals of the conventional plug connector are arranged in the upper and lower rows on the insulating body. The conductive terminals in each row include, sequentially from left to right, a grounding terminal, a pair of differential signal terminals (high-speed terminals) for transmitting USB 3.0 signals, a power supply terminal, a reserved terminal, a pair of USB 2.0 terminals, a reserved terminal, a power supply terminal, a pair of differential signal terminals (high-speed terminals) for transmitting USB 3.0 signals and a grounding terminal. Referring to FIG. 3 and FIG. 5, in this embodiment, each of the second mating portions 571 occupies a position of the pair of USB 2.0 terminals, and the other conductive terminals 532 are unchanged. In other words, the second mating portions 571 in this embodiment replace the pair of USB 2.0 terminals. Thus, the plug connector 5 is a non-standard USB Type-C plug connector.

Referring to FIG. 3 to FIG. 7, when the plug connector 5 moves toward the socket connector 4, and the plug connector 5 is completely mated with the socket connector 4 forwardly or reversely, the front end of the mating joint 53 is inserted into the accommodating cavity 46. At this time, the first contact portions 421 are in contact with the second contact portions 5321 to form an electrical connection, the latch portions 5332 are buckled to the latch notches 431, the grounding contact 5351 abuts the grounding member 44 to form a grounding path, and the shielding shell 534 is in contact with the metal shell 45 to form a grounding path. Meanwhile, the second mating portion 571 is elastically in contact with the first mating portion 471 so as to form a thermal conduction, such that the heat generated by the chip 52 is quickly transferred to the first thermal conduction member 47 through the second thermal conduction member 57.

The fan body 31 operates to drive air to flow quickly. Since the air outlet 32 directly faces the heat dissipating portion 472 and the metal shell 45, air flow around the heat dissipating portion 472 and the metal shell 45 may be accelerated to perform heat dissipation on the first thermal conduction members 47. In addition, the air outlet 32 also accelerates air flow around the heat dissipation pattern on the main board 2 which is thermally conductive with the first thermal conduction members 47, so as to increase the heat dissipation area and accelerate the heat dissipation. The heat dissipated into the casing 1 is then transferred to the outside air through the heat dissipation structure in the casing 1.

Figure 9:
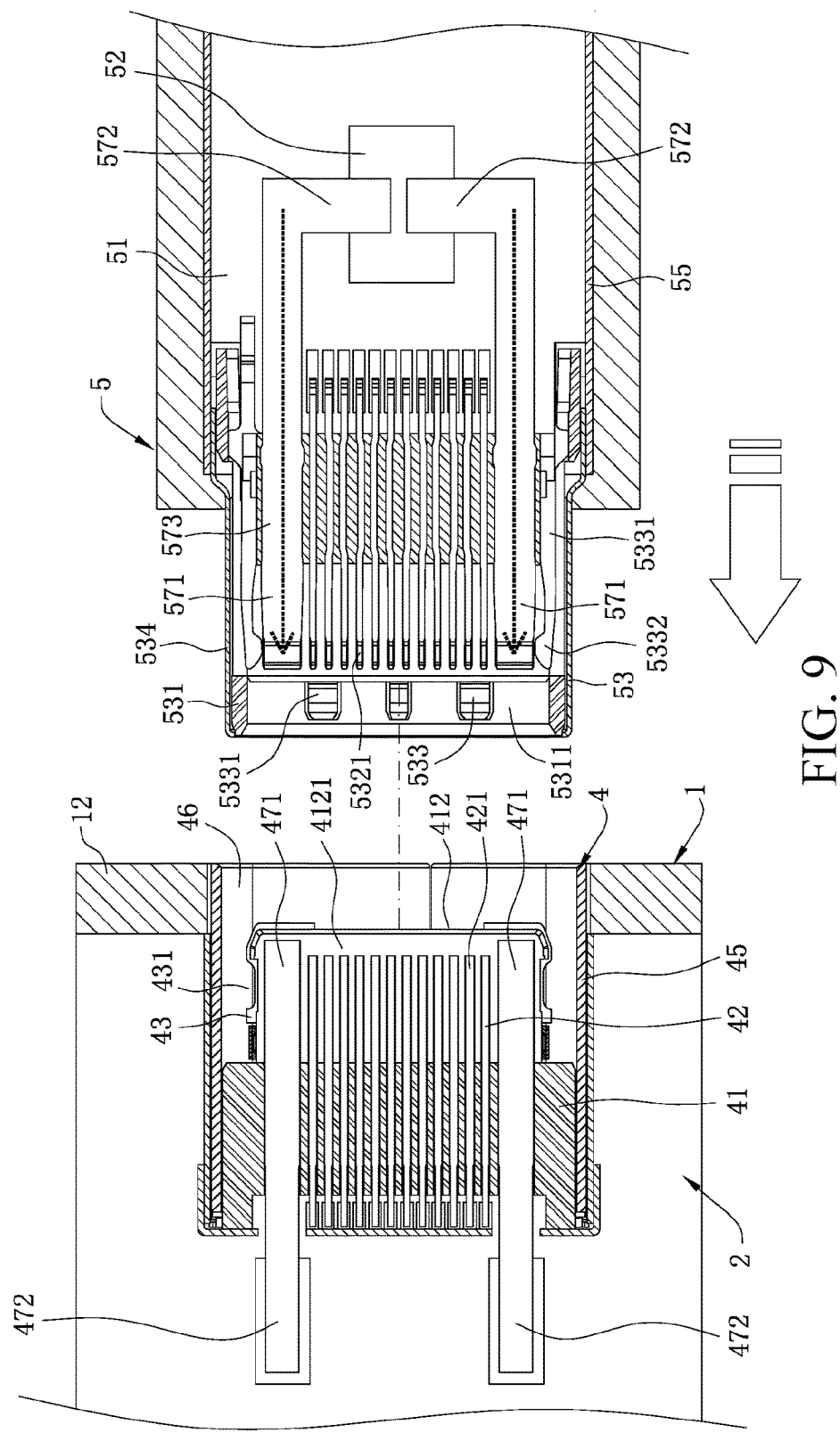
FIG. 9 is a schematic view of a connector assembly according to a second embodiment of the present invention.

Referring to FIG. 5, FIG. 6 and FIG. 9, FIG. 9 shows a connector assembly according to a second embodiment of the present invention. The general structures of the connector assembly in this embodiment are the same as those of the first embodiment, and the same structures will not be elaborated again. The different structures in this embodiment are described as follows. Each of the first surfaces 4121 is similarly provided with the first contact portions 421, which are flat plate shaped and are provided side by side in the left-right direction. Two first mating portions 471 are exposed from each of the first surfaces 4121, and the first mating portions 471 exposed from the two first surfaces 4121 are aligned vertically. On each of the first surfaces 4121, only one side of the first mating portion 471 is provided with the first contact portions 421. That is, on each of the first surfaces 4121, the first contact portions 421 are located between the two first mating portions 471 on the same plane. The mating terminals 42 provided on each of the first surfaces 4121 include, sequentially from left to right, a grounding terminal, a pair of differential signal terminals (high-speed terminals) for transmitting USB 3.0 signals, a power terminal, a reserved terminal, a pair of USB 2.0 terminals, a reserved terminal, a power terminal, a pair of differential signal terminals (high-speed terminals) for transmitting USB 3.0 signals and a grounding terminal. Similar to the first embodiment, the first contact portions 421 and the first mating portions 471 on the two first surfaces 4121 are symmetrical about the center of the accommodating cavity 46 at 180 degrees, and each of the upper and lower rows of the second contact portions 5321 in the plug connector 5 is also provided with the two second mating portions 571. Since the plug connector 5 is mated with the socket connector 4, the two second mating portions 571 in each row are also located on the relatively outermost sides of each row in the left-right direction. The two rows of the second contact portions 5321 and the second mating portions 571 are symmetrical about the center of the mating slot 5311 at 180 degrees. The conductive terminals in each row on the upper and lower sides of the mating slot 5311 include, sequentially from left to right, a grounding terminal, a pair of differential signal terminals (high-speed terminals) for transmitting USB 3.0 signals, a power supply terminal, a reserved terminal, a pair of USB 2.0 terminals, a reserved terminal, a power supply terminal, a pair of differential signal terminals (high-speed terminals) for transmitting USB 3.0 signals and a grounding terminal. Thus, the plug connector 5 may be inserted into the socket connector 5 forwardly or reversely. In other embodiments, the socket connector 4 is provided with at least one first thermal conduction member 47. The first mating portion 471 is only exposed from one of the first surfaces 4121 provided with the first contact portions 421, and the first mating portion 471 may be provided on one side of the first contact portions 421 or provided among the first contact portions 421. Correspondingly, the plug connector 5 may be only provided with one second thermal conduction member 57, and the second thermal conduction member 57 is only provided with one second mating portion 571 which is in contact with the first mating portion 471 to form a thermal conduction. In still another embodiment, the tongue 412 may be formed by a PCB. The first contact portions 421 are conductive traces on the PCB, and the first mating portions 471 are thermally conductive patterns on the PCB. Thus, a corresponding connection may be formed respectively with the conductive traces and the thermally conductive patterns on the PCB through multiple conversion terminals and at least one conversion thermal conduction member.

To sum up, the connector assembly according to certain embodiments of the present invention has the following beneficial effects:

1. The socket connector 4 is provided with the first thermal conduction member 47. The first thermal conduction member 47 has the first mating portion 471, and the first mating portion 471 is exposed from the at least one first surface 4121 of the tongue 412 provided with the first contact portions 421. The plug connector 5 is provided with the second thermal conduction member 57, and the second thermal conduction member 57 is provided with the second mating portion 571 and the conducting portion 572 which is thermally conducted with the chip 52 inside the plug connector 5. When the plug connector 5 is completely mated with the socket connector 4, the first contact portions 421 are in contact with the second contact portions 5321 to form an electrical connection, and the second mating portion 571 is in contact with the first mating portion 471 to form a thermal conduction, and heat generated by the chip 52 is transferred to the first thermal conduction member 47 through the second thermal conduction member 57, thereby quickly dissipating the heat generated by the chip 52 out of the inside of the plug connector 4.

2. The width of each first mating portion 471 in the left-right direction is twice or more than twice the width of each first contact portion 421 in the left-right direction, and the width of each second mating portion 571 in the left-right direction is twice or more than twice the width of each second contact portion 5321 in the left-right direction. Thus, when the first mating portion 471 is mated with the second mating portion 571, a large contact area can be implemented, and the second thermal conduction member 57 can quickly transfer the heat obtained from the chip 52 to the first thermal conduction member 47, thereby accelerating the dissipation of the heat inside the plug connector 5.

3. The masking shell 55 is provided with the abutting portion 551 which is in contact with the chip 52, and the conducting portion 572 is in contact with the masking shell 55 or the shielding shell 534, such that the heat generated by the chip 52 may be transferred out through the second thermal conduction member 57. Further, a part of the heat generated by the chip 52 can be transferred to the metal shell 45 through the contact between the shielding shell 534 and the metal shell 45 when the plug connector 5 is mated with the socket connector 4. Moreover, the heat dissipating device 3 may also accelerate air flow around the metal shell 45 to perform heat dissipation on the metal shell 45.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A connector assembly, comprising:
   a socket connector, comprising:
     a main body, having a tongue, wherein the tongue has two first surfaces provided opposite to each other;
     a plurality of mating terminals, provided on the main body, wherein each of the mating terminals has a first contact portion, and the first contact portions of the mating terminals are exposed from at least one of the first surfaces; and
     at least one first thermal conduction member, provided on the main body, wherein the first thermal conduction member has a first mating portion, and the first mating portion is exposed to the at least one of the first surfaces provided with the first contact portions of the mating terminals; and
   a plug connector, comprising:
     a circuit board;
     at least one chip, provided on the circuit board;
     a mating joint, electrically connected to one end of the circuit board, wherein the mating joint has an insulating body and a plurality of conductive terminals provided on the insulating body; and
     at least one second thermal conduction member, provided on the insulating body, wherein the second thermal conduction member has a second mating portion and a conducting portion, and the conducting portion is thermally conducted with the chip,
   wherein when the plug connector is mated with the socket connector, the first contact portions of the mating terminals are in contact with the conductive terminals to form an electrical connection, and the first mating portion is in contact with the second mating portion to form thermal conduction.

2. The connector assembly according to claim 1, wherein the first contact portions of the mating terminals and the first mating portion are provided side by side on the at least one of the first surfaces, and two opposite sides of the first mating portion are respectively provided with the first contact portions.

3. The connector assembly according to claim 1, wherein the first contact portions of the mating terminals and the first mating portion are provided side by side on the at least one of the first surface, and only one side of the first mating portion is provided with the first contact portions.

4. The connector assembly according to claim 1, wherein a width of the first mating portion is twice or more than twice a width of each of the first contact portions of the mating terminals.

5. The connector assembly according to claim 1, wherein the tongue is formed by a printed circuit board (PCB), each of the first contact portions is an electrical conduction trace on the PCB, and the first mating portion is a thermal conduction trace on the PCB.

6. The connector assembly according to claim 1, wherein each of the first surfaces is provided with multiple ones of the first contact portions, the first mating portion is exposed from each of the first surfaces, the conductive terminals have a plurality of second contact portions arranged in two rows, and the plug connector is provided with two second mating portions correspondingly in contact with the first mating portion.

7. The connector assembly according to claim 1, wherein each of the first surfaces is provided with multiple ones of the first contact portions and a first mating portion, the conductive terminals have a plurality of second contact portions arranged in two rows, and the plug connector is provided with two second mating portions correspondingly in contact with the two first mating portions of the first surfaces.

8. The connector assembly according to claim 1, wherein the socket connector further comprises a metal shell, the metal shell surrounds the tongue to define an accommodating cavity therebetween, each of the first surfaces is provided with multiple ones of the first contact portions and at least two first mating portions, and the first contact portions and the first mating portions exposed from the two first surfaces are respectively symmetrical about a center point of the accommodating cavity at 180 degrees.

9. The connector assembly according to claim 1, wherein the conducting portion protrudes out of the insulating body and is in contact with the chip to form thermal conduction.

10. The connector assembly according to claim 1, wherein the mating joint further has a shielding shell provided outside the insulating body, and the second mating portion is accommodated in the shielding shell.

11. The connector assembly according to claim 10, wherein the plug connector further comprises a masking shell provided at a rear end of the shielding shell, the circuit board is located in the masking shell, and the masking shell has an abutting portion in contact with the chip or the conducting portion.

12. The connector assembly according to claim 1, wherein at least one of the first thermal conduction member and the second thermal conduction member is a thermal transistor or a capillary.

13. The connector assembly according to claim 1, wherein the mating terminals on each of the first surfaces are provided side by side in a left-right direction, and comprise, sequentially from left to right, a grounding terminal, a pair of differential signal terminals for transmitting universal serial bus (USB) 3.0 signals, a power terminal, a reserved terminal, a pair of USB 2.0 terminals, a reserved terminal, a power terminal, a pair of differential signal terminals for transmitting USB 3.0 signals and a grounding terminal.

14. The connector assembly according to claim 1, wherein the socket connector is mounted on a main board and exposed from one side of a casing, the main board is located in the casing, a heat dissipating device is provided in the casing, the at least one first thermal conduction member has a heat dissipating portion protruding out of the socket connector, and the heat dissipating device is configured for dissipating heat from the heat dissipating portion.

15. The connector assembly according to claim 1, wherein a front end of the insulating body has a mating slot configured to accommodate the tongue, each of the conductive terminals has a second contact portion, the second contact portion and the second mating portion respectively protrude into the mating slot, the plug connector further comprises two latch arms located at a left side and a right side of the mating slot, each of the latch arms has a latch portion protruding into the mating slot, the socket connector further comprises a middle shielding plate located between the two first surfaces, the middle shielding plate has two latch notches respectively exposed from a left side and a right side of the tongue, and the latch portions of the two latch arms are configured to be buckled to the latch notches.

\* \* \* \* \*